(12) United States Patent
Shim (10) Patent No.: US 7,642,659 B2
(45) Date of Patent: Jan. 5, 2010

(54) WIRE PAD OF SEMICONDUCTOR DEVICE

(75) Inventor: Cheon-Man Shim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 217 days.

(21) Appl. No.: 11/853,547

(22) Filed: Sep. 11, 2007

(65) Prior Publication Data

US 2008/0073791 A1 Mar. 27, 2008

(30) Foreign Application Priority Data

Sep. 25, 2006 (KR) .................. 10-2006-0092886

(51) Int. Cl.
*H01L 29/40* (2006.01)
(52) U.S. Cl. .................. 257/784; 257/E23.01; 438/612
(58) Field of Classification Search ............. 257/784, 257/E23.01; 438/612
See application file for complete search history.

(56) References Cited

U.S. PATENT DOCUMENTS

2008/0073791 A1* 3/2008 Shim ..................... 257/762

* cited by examiner

*Primary Examiner*—Mark Prenty
(74) *Attorney, Agent, or Firm*—Sherr & Vaughn, PLLC (57) ABSTRACT

A semiconductor device includes a low-k layer formed over a semiconductor device; a first TEOS film formed over the low-k layer; a SiCN layer formed over the first TEOS film; an undoped silicate glass film formed over the SiCN layer; a nitride film formed over the USG film; a second TEOS film formed over the nitride film; a first metal interconnect extending from the low-k layer to the undoped silicate glass film; and a second metal interconnect extending from the nitride film to the second TEOS film, wherein the first metal interconnect and the second metal interconnect are electrically connected and a wire is bonded to the second metal interconnect.

20 Claims, 6 Drawing Sheets

WIRE PAD OF SEMICONDUCTOR DEVICE

The present application claims priority under 35 U.S.C. 119 to Korean Patent Application No. 10-2006-0092886 (filed on Sep. 25, 2006), which is hereby incorporated by reference in its entirety.

BACKGROUND

Figure 1:
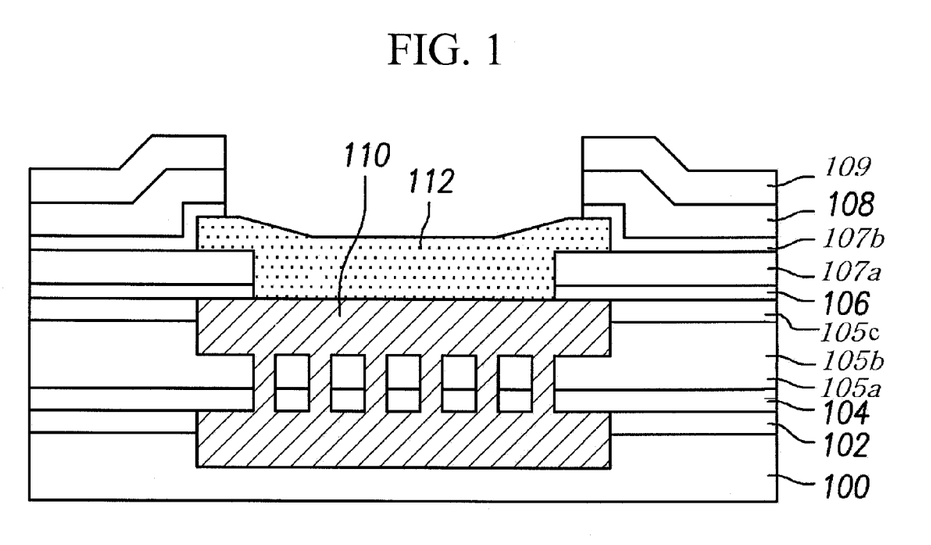
FIG. 1 illustrates a semiconductor device.

As illustrated in example FIG. 1, a wire pad of a semiconductor device includes low-k layer 100, oxide layer 102, SiCN layer 104, nitride film 106, and TEOS film 108, which are sequentially formed to predetermined thicknesses. Layers 105a, 105b and 105c are formed between SiCN layer 104 and nitride film 106. Layers 107a and 107b are formed between nitride film 106 and TEOS film 108 while layer 109 is formed over TEOS film 108. Copper line 110 passing through the low-k layer 100 and SiCN layer 104 through a damascene process, and aluminum copper line 112 passing through nitride film 106 and TEOS film 108.

Figure 2:
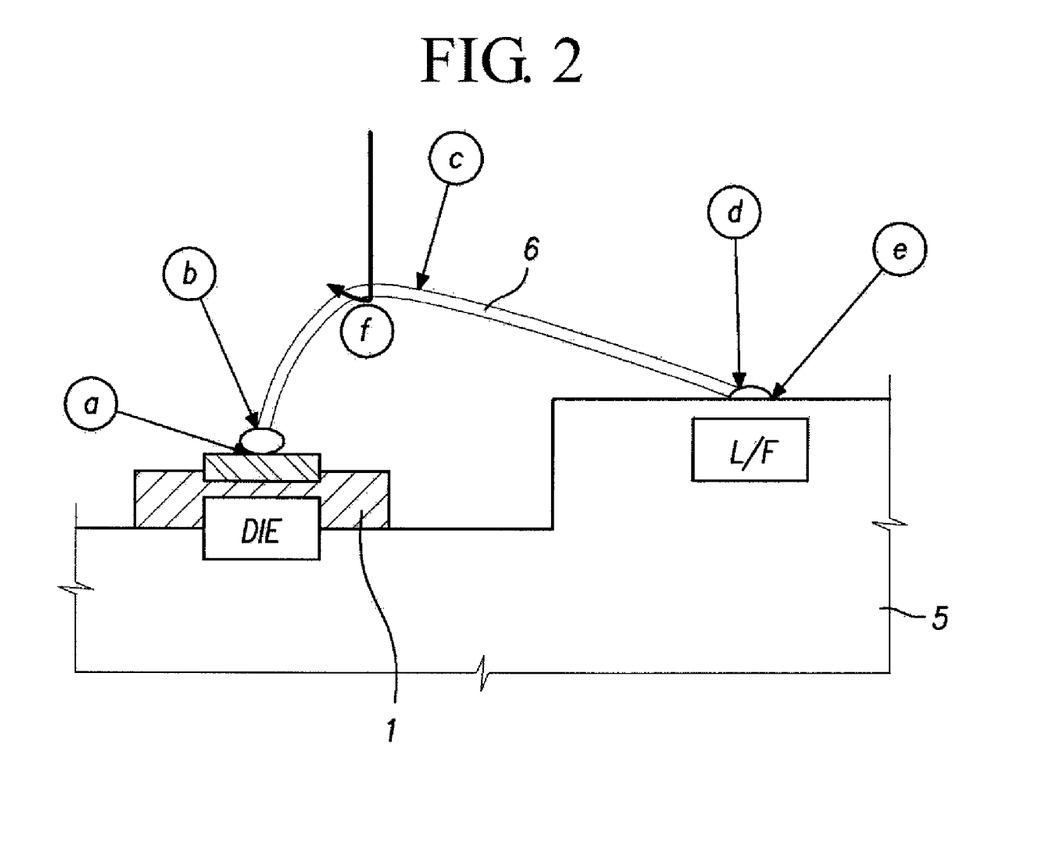
FIG. 2 illustrates a block diagram of a structure for an EM/SM test of a semiconductor device.

Example FIG. 2 illustrates a device for performing an EM/SM (Electro-migration/Stress-migration) test of a semiconductor device through the application of a force for a predetermined time. Semiconductor device 1 is located at one side of PCB 5, and includes pad 'a' which electrically connected to PCB 5 using wires 6. Semiconductor pad 'a' is electrically connected to wire 6 via contact 'b.' Wire portion 'c' electrically connects wire 6 at another end to pad 'e' of PCB 5 at contact 'd.'

An EM/SM test of plural semiconductor devices 1 having eight pads was carried out was carried out by applying predetermined force to the points of action 'f' of the wire 6 for a predetermined test time. Table 1 illustrates the results of the EM/SM test of the semiconductor device 1.

TABLE 1

| | DEK213 #03 | | | | | | | | |
|---|---|---|---|---|---|---|---|---|---|
| Wire # | Tensile Strength of Wire | | | | | | | | |
| PKG # | #01 | #02 | #03 | #04 | #05 | #06 | #07 | #08 | AVG |
| C13#01 | 0.5 | 0.5 | 0.5 | 0.5 | 0.5 | 0.5 | 0.5 | 0.8 | 0.50 |
| C13#02 | 1.0 | 1.0 | 0.5 | 0.5 | 0.5 | 0.5 | 1.0 | 1.0 | 0.75 |
| C13#03 | 0.5 | 0.5 | 0.5 | 0.5 | 0.5 | 0.5 | 0.5 | 0.5 | 0.50 |
| C13#04 | 0.5 | 1.5 | 0.5 | 0.5 | 0.5 | 0.5 | 1.0 | 0.5 | 0.69 |
| C13#05 | 0.5 | 0.5 | 0.3 | 0.5 | 0.5 | 0.5 | 0.5 | 0.5 | 0.48 |
| C13#06 | x | 0.5 | 0.5 | 0.5 | 1.0 | 2.5 | 0.7 | 1.0 | 0.96 |
| C13#07 | 0.5 | 0.5 | 0.3 | 0.3 | 0.3 | 0.3 | 0.5 | 1.0 | 0.44 |
| C13#08 | 0.2 | 0.2 | 0.2 | 0.2 | 0.2 | 0.2 | 0.5 | 0.5 | 0.28 |
| C13#09 | 0.2 | 0.5 | 0.5 | 0.5 | 0.3 | 0.3 | 1.0 | 0.5 | 0.48 |
| C13#10 | 0.5 | 1.0 | 0.5 | 0.5 | 0.2 | 0.5 | 0.5 | 0.5 | 0.53 |
| C13#11 | 0.5 | 0.5 | 0.5 | 0.3 | 0.5 | 0.5 | 0.5 | 0.5 | 0.48 |
| C13#12 | 0.5 | 0.5 | 0.5 | 0.2 | 0.5 | 0.5 | 0.5 | 0.2 | 0.43 |
| C13#13 | 0.3 | 0.5 | 0.2 | 0.3 | 0.3 | 0.2 | 0.5 | 0.5 | 0.35 |
| C13#14 | 0.5 | 0.7 | 0.2 | 0.2 | 0.3 | 0.3 | 0.3 | 0.3 | 0.35 |
| C13#15 | 0.5 | .5 | 0.3 | 0.3 | 0.3 | 0.5 | 0.5 | 0.5 | 0.43 |
| C13#16 | x | x | 0.3 | 0.3 | 0.3 | 0.3 | 0.5 | 0.3 | 0.33 |
| C13#17 | 0.3 | 0.5 | 0.5 | 0.3 | 0.3 | 0.3 | 0.3 | 0.3 | 0.35 |
| C13#18 | 0.3 | 0.5 | 0.3 | 0.3 | 0.5 | 0.5 | 0.5 | 0.5 | 0.43 |
| C13#19 | 0.5 | 0.5 | 0.2 | 0.3 | 0.2 | 0.3 | 0.5 | 0.5 | 0.38 |
| C13#20 | 0.7 | 0.7 | 0.5 | 0.3 | 0.3 | 0.5 | 1.0 | 1.0 | 0.63 |
| C13#21 | 0.5 | 0.5 | 0.2 | 0.3 | 0.2 | 0.3 | 0.5 | 0.5 | 0.38 |
| C13#22 | 0.5 | 0.5 | 0.3 | 0.3 | 0.2 | 0.2 | 0.3 | x | 0.33 |
| C13#23 | 0.2 | 0.2 | 0.2 | 0.3 | 0.3 | 0.3 | 0.5 | 0.5 | 0.31 |
| C13#24 | 0.5 | 0.5 | 0.5 | 0.2 | 0.2 | 0.2 | 0.3 | 0.3 | 0.34 |
| C13#25 | 0.5 | 0.5 | 0.3 | 0.3 | 0.3 | 0.3 | 2.5 | 0.5 | 0.65 |

As illustrated in Table 1, the EM/SM test 'x' denotes that the wire is not bounded in the regions (a) to (e) even when predetermined force is applied to the point (f) of action for a predetermined test time.

Accordingly, Table 1 shows that the wires 6 were easily bounded in the regions between 'a' to 'e', when a predetermined force, for example, approximately 0.5 g, is applied to the points 'f' of action of wire 6 in the EM/SM test.

Particularly, in situations of a semiconductor device using a Cu/low-k layer, the low-k layer has a low mechanical strength and a bonding force between the low-k layer. In turn, SiCN (or SiCON) layer, serving as a barrier layer, is weak. Accordingly, the semiconductor device may be deficient in terms of wire bounding in wire bonds.

SUMMARY

In accordance with embodiments, a wire pad for a semiconductor device which does not cause a wire to be bounded in wire bonding.

Embodiments relate to a wire pad of a semiconductor device including: a low-k layer formed on and/or over the entire upper surface of the semiconductor device to a predetermined thickness; an oxide layer formed on and/or over the entire upper surface of the low-k layer to a predetermined thickness; a SiCN layer formed on and/or over the entire upper surface of the oxide layer to a predetermined thickness; an undoped silicate glass (USG) film formed on and/or over the entire upper surface of the SiCN layer to a predetermined thickness; a nitride film formed on and/or over the entire upper surface of the USG film to a predetermined thickness; a tetra ethyl ortho silicate (TEOS) film formed on and/or over the entire upper surface of the nitride film to a predetermined thickness; a first metal interconnect extending through the low-k layer to the USG film using a damascene process on the low-k layer to the TEOS film; a second metal interconnect passing through the nitride film and the TEOS film; and a wire bonded to the second metal interconnect, wherein the first metal interconnect and the second metal interconnect are electrically connected.

Embodiments relate to a wire pad of a semiconductor device including a low-k layer formed on and/or over and/or over the entire upper surface of the semiconductor device to a predetermined thickness; a first TEOS film formed on and/or over the entire upper surface of the low-k layer to a predetermined thickness; a SiCN layer formed on and/or over the entire upper surface of the first TEOS film to a predetermined thickness; an USG film formed on and/or over the entire upper surface of the SiCN layer to a predetermined thickness; a nitride film formed on and/or over the entire upper surface of the USG film to a predetermined thickness; a second TEOS film formed on and/or over the entire upper surface of the nitride film to a predetermined thickness; a first metal interconnect passing through the low-k layer to the USG film using a damascene process on and/or over the low-k layer to the second TEOS film; a second metal interconnect extending from the nitride film to the second TEOS film; and a wire bonded to the second metal interconnect, wherein the first metal interconnect and the second metal interconnect are electrically connected.

DRAWINGS

Example

Example

Example

Example

Example

Example

DESCRIPTION

Figure 3:
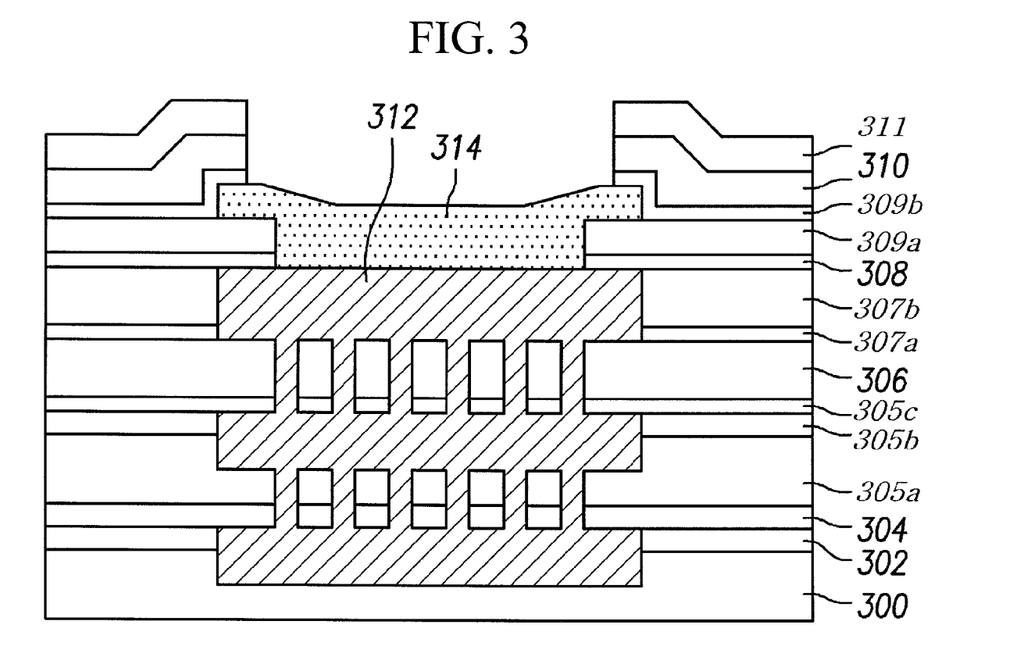
FIG. 3 illustrates a semiconductor device, in accordance with embodiments.

As illustrated in example FIG. 3, a wire pad of a semiconductor device in accordance with embodiments may include low-k layer 300, oxide layer 302, SiCN layer 304, undoped silicate glass (USG) film 306, nitride film 308, and tetra ethyl ortho silicate (TEOS) film 310, which are sequentially formed to predetermined thicknesses. Layers 305a, 305b and 305c are formed between SiCN layer 304 and USG film 306. Layers 307a and 307b are formed between USG film 306 and nitride film 308. Layers 309a and 309b are formed between nitride film 308 and TEOS film 310 while layer 311 is formed over TEOS film 310. Nitride film 308 may be composed of SiN. First metal interconnect 312, which may be composed of copper, may extend from low-k layer 300 to USG film 306 using a damascene process. Second metal interconnect 314, which may be composed of a compound including aluminum and copper, extends from nitride film 308 to TEOS film 310.

Figure 4:
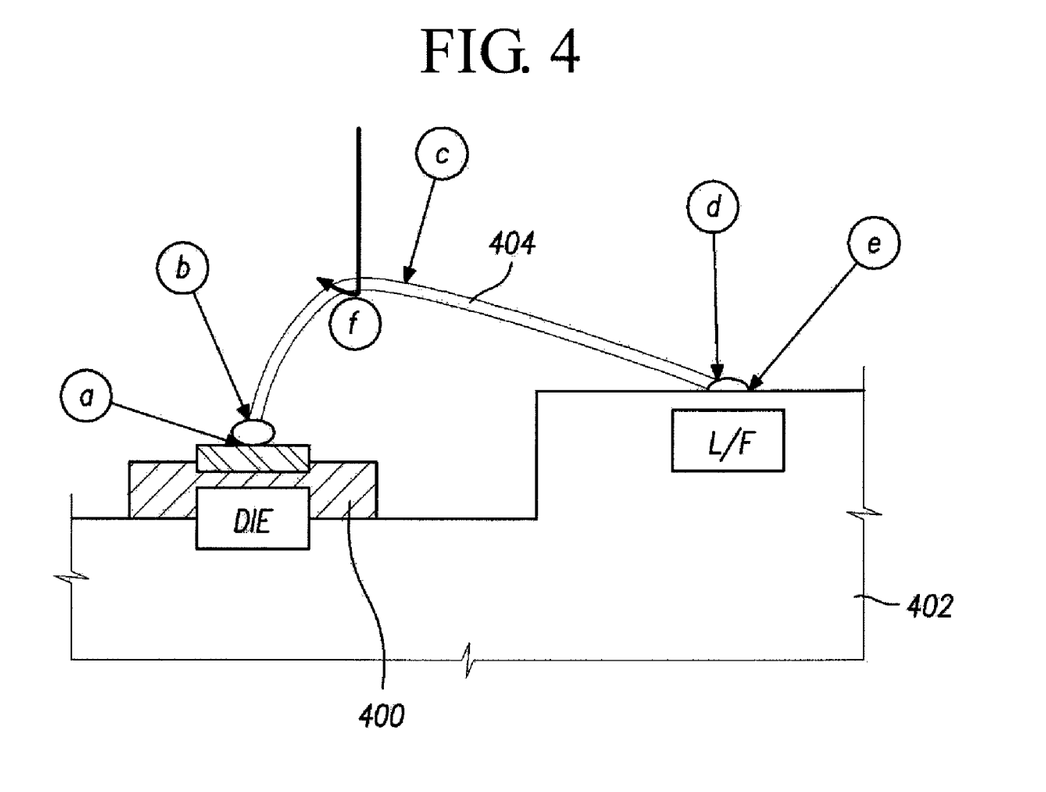
FIG. 4 illustrates a block diagram of an EM/SM test of a semiconductor device, in accordance with embodiments.

As illustrated in example FIG. 4, an EM/SM test of semiconductor device 400 located at one side of PCB 402 and electrically connected to PCB 402 using wire 404. Pad 'a' of semiconductor device 400 can be bonded to wire 404 using contact 'b.' Wire 404 can be bonded at another end to pad 'e' of PCB 402 using contact 'd.'

An EM/SM test of twenty-five semiconductor devices 400 having eight pads was conducted by applying predetermined force to point of action 'f' adjacent portion 'c' of wire 404 for a predetermined test time. Example Table 2 shows the results of the EM/SM test of semiconductor devices 400.

TABLE 2

| Wire # | DEK213 #04 Tensile Strength of Wire | | | | | | | | |
|---|---|---|---|---|---|---|---|---|---|
| PKG # | #01 | #02 | #03 | #04 | #05 | #06 | #07 | #08 | AVG |
| 04-1 | 5.0d | 6.0a | 5.5a | 7.2a | 5.5a | 2.0a | 7.5a | 5.8a | 5.56 |
| 04-2 | 5.0a | 5.8a | 6.0d | 5.8d | 6.5d | 5.8d | 6.0d | 6.0d | 5.86 |
| 04-3 | 5.0a | 7.5d | 6.0d | 6.0d | 6.5d | 5.5d | 6.0a | 0.5a | 5.36 |
| 04-4 | 6.0e | 6.5a | 6.0a | 7.2a | 6.5d | x | 6.0e | 1.5a | 5.67 |
| 04-5 | 1.0a | x | x | X | 1.2a | x | 2.5a | x | 1.57 |
| 04-6 | 1.0a | 3.0a | 2.5a | 2.0a | 2.0a | 1.5a | 1.0a | 1.0a | 1.75 |
| 04-7 | X | x | 0.5a | 5.5d | 2.0a | 1.0a | 1.2a | x | 2.04 |
| 04-8 | 1.5a | x | 7.0d | 6.5d | 3.0a | 1.0a | X | x | 3.80 |
| 04-9 | 2.0a | 5.0d | 5.5d | 5.0d | 5.0d | 5.5d | 5.2d | 5.0d | 4.78 |
| 04-10 | 6.0d | 7.0a | 6.0d | 5.5d | 5.0d | 5.0d | 5.8a | 1.0a | 5.04 |
| 04-11 | 0.5a | 6.0d | 5.5d | 5.5d | 5.3d | 5.0d | X | 6.0d | 4.83 |
| 04-12 | 6.0d | 5.2d | 5.0a | 5.7d | 5.5d | 5.0d | 4.5a | 6.5d | 5.42 |
| 04-13 | 6.0d | 5.5d | 5.5d | 5.0d | 6.0d | 5.7d | 5.5d | 5.5d | 5.59 |
| 04-14 | 7.2d | 4.5a | 5.8d | 5.5d | 5.5d | 4.5a | 6.0a | 5.5d | 5.56 |
| 04-15 | 5.2a | 4.8d | 4.5a | 5.5d | 4.0a | 5.5d | 6.0d | 6.2a | 5.51 |
| 04-16 | 5.5a | 6.0d | 5.7d | 5.2d | 5.0d | 5.0a | 4.5d | 5.5a | 5.30 |
| 04-17 | 7.8d | 5.7a | 2.5a | 5.2a | 5.7d | 5.5d | 6.5a | 5.0a | 5.49 |
| 04-18 | 6.0d | 7.0d | 5.8d | 5.8d | 5.5d | 5.0a | 5.0a | 6.0a | 5.76 |
| 04-19 | 7.5d | 6.2d | 5.0a | 5.5a | 5.7d | 5.7d | 5.0a | 5.0a | 5.70 |
| 04-20 | 5.2a | 5.0a | 5.8d | 5.5d | 5.5d | 6.0d | 5.5a | 7.0d | 5.69 |
| 04-21 | 6.2d | 6.0a | 5.2d | 5.7d | 4.5a | 6.0d | 4.7a | 6.5a | 5.60 |
| 04-22 | 5.0a | 6.0d | 5.2a | 6.0d | 3.0a | 3.2a | 6.5a | 5.7d | 5.08 |
| 04-23 | 5.8d | 6.7d | 5.5d | 6.0d | 5.0a | 4.8a | 5.5a | 6.7a | 5.475 |
| 04-24 | 6.2a | 6.8a | 6.2d | 4.8a | 5.5d | 3.0a | 5.5a | 5.7d | 5.46 |
| 04-25 | 6.5d | 6.0d | 6.0d | 5.7d | 6.7d | 6.0d | 7.0d | 7.0d | 6.36 |

Figure 5:
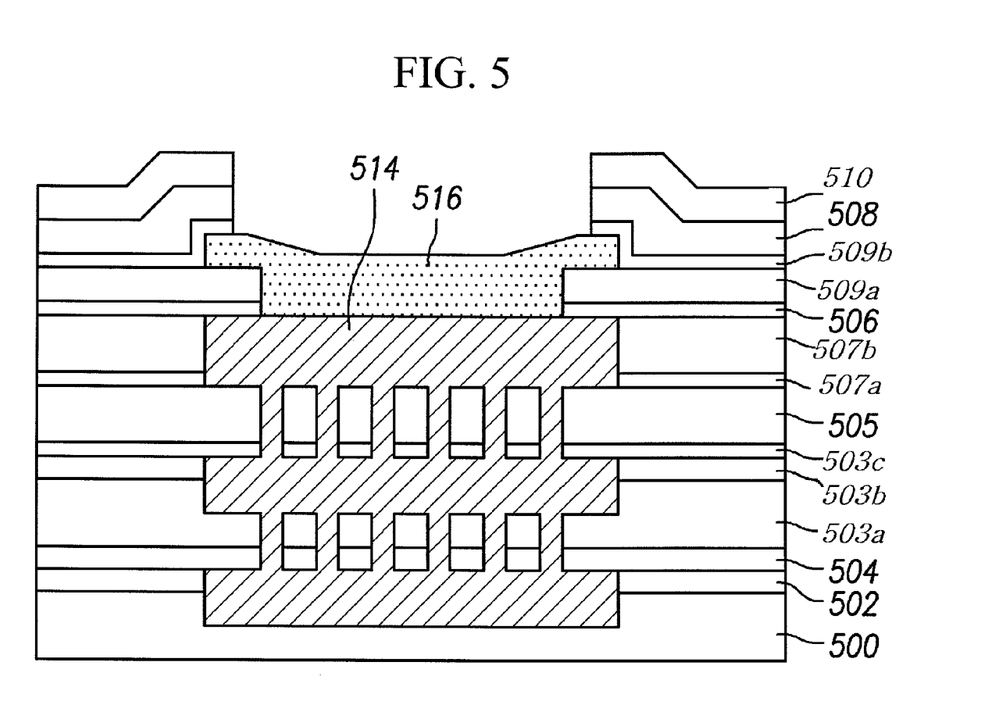
FIG. 5 illustrates a semiconductor device, in accordance with embodiments.

As illustrated in example FIG. 5, embodiments relate to a wire pad of a semiconductor device including low-k layer 500, first TEOS film 502, SiCN layer 504, USG film 505, nitride film 506, and second TEOS film 508, which are sequentially formed to predetermined thicknesses. Layers 503a, 503b and 503c are formed between SiCN layer 504 and USG film 505. Layers 507a and 507b are formed between USG film 505 and nitride film 506. Layers 509a and 509b are formed between nitride film 506 and second TEOS film 508 while layer 510 is formed over second TEOS film 508. Nitride film 506 may be composed of SiN. First metal interconnect 514, which may be composed of copper, extends from low-k layer 500 to USG film 505 using a damascene process. Second metal interconnect 516, which may be composed of an aluminum-copper compound, extends from nitride film 506 to second TEOS film 508.

As illustrated in example Table 2, 'x' denotes that the wire is not bounded in the regions between 'a' and 'e' when a predetermined force, for example, 5 g or more, is applied to the point of action 'f' for a predetermined test time. Further, data without any of designation 'a' to 'e' denote that the wire is bounded in region 'd.'

Accordingly, example Table 2 illustrates that wire 404 were bounded in the regions 'a' to 'e' when such a predetermined force is applied to the point of action 'f' of wire 404. In accordance with embodiments, the wire pad of semiconductor device 400 including oxide layer 302, USG film 306 formed between SiCN layer 304 and nitride layer 308, has a wire bonding force that is ten times that exhibited by other semiconductor devices.

As illustrated in example FIG. 5, embodiments relate to a wire pad of a semiconductor device including low-k layer 500, first TEOS film 502, SiGN layer 504, USG film 505, nitride film 506, and second TEOS film 508, which are sequentially formed to predetermined thicknesses. Layers 503a, 503b and 503c are formed between SiGN layer 504 and USG film 505. Layers 507a and 507b are formed between USG film 505 and nitride film 506. Layers 509a and 509b are formed between nitride film 506 and second TEOS film 508 while layer 510 is formed over second TEOS film 508. Nitride film 506 may be composed of SiN. First metal interconnect 514, which may be composed of copper, extends from low-k layer 500 to USG film 505 using a damascene process. Second metal interconnect 516, which may be composed of an aluminum-copper compound, extends from nitride film 506 to second TEOS film 508.

Figure 6:
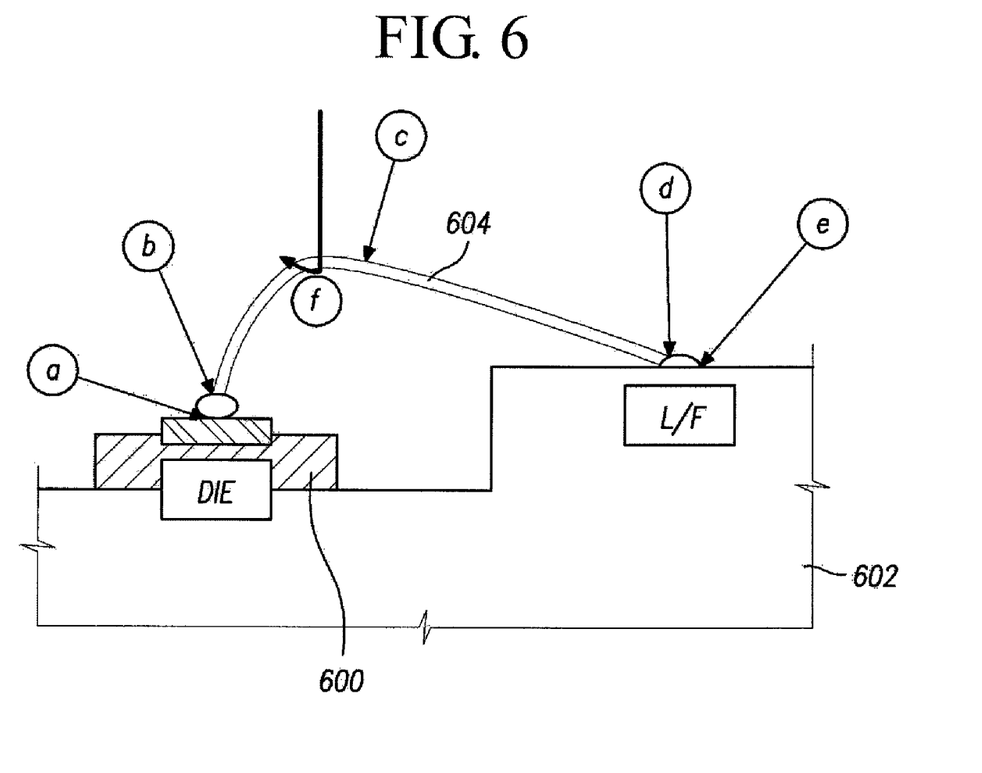
FIG. 6 illustrates a block diagram of an EM/SM test of a semiconductor device, in accordance with embodiments.

As illustrated in example FIG. 6, an EM/SM test of semiconductor device 600 located at one side of PCB 602 and electrically connected to PCB 402 using wire 604. Pad 'a' of semiconductor device 600 can be bonded to wire 604 using contact 'b.' Wire 604 can be bonded at another end to pad 'e' of PCB 602 using contact 'd.'

An EM/SM test of twenty-five semiconductor devices 600 having eight pads was conducted by applying predetermined force to point of action 'f' adjacent portion 'c' of wire 404 for a predetermined test time. Example Table 3 shows the results of the EM/SM test of semiconductor devices 600.

TABLE 3

| Wire # | DEK213 #11 Tensile Strength of Wire | | | | | | | | |
|---|---|---|---|---|---|---|---|---|---|
| PKG # | #01 | #02 | #03 | #04 | #05 | #06 | #07 | #08 | AVG |
| 11-1 | 6.0 | 6.5 | 7.5 | 6.3 | 7.0 | 6.5 | 7.6 | 6.8 | 8.8 |
| 11-2 | 5.5 | 5.0 | 6.0 | 6.2 | 6.0 | 6.5 | 6.2 | 6.8 | 6.03 |
| 11-3 | 7.5 | 6.7 | 5.6 | 6.6 | 6.0 | 6.2 | 6.5 | 7.5 | 6.58 |
| 11-4 | 5.8 | 6.0 | 6.0 | 6.0 | 5.5 | 7.0 | 7.6 | 6.2 | 6.26 |
| 11-5 | 7.0 | 6.5 | 5.8 | 6.2 | 8.2 | 5.0 | 7.5 | 7.8 | 6.75 |

TABLE 3-continued

DEK213 #11

| Wire # | Tensile Strength of Wire | | | | | | | | |
|---|---|---|---|---|---|---|---|---|---|
| PKG # | #01 | #02 | #03 | #04 | #05 | #06 | #07 | #08 | AVG |
| 11-6 | 5.8 | 5.0 | 5.0 | 5.2 | 5.5 | 5.0 | 6.0 | 5.2 | 5.34 |
| 11-7 | 7.0 | 6.5 | 5.5 | 6.0 | 6.5 | 5.6 | 6.6 | 5.5 | 6.15 |
| 11-8 | 6.8 | 6.8 | 6.0 | 7.8 | 7.5 | 6.0 | 6.5 | 6.0 | 6.67 |
| 11-9 | 7.5 | 6.7 | 5.0 | 5.0 | 5.5 | 6.5 | 6.2 | 6.0 | 6.05 |
| 11-10 | 6.8 | 6.0 | 5.8 | 5.2 | 6.5 | 5.5 | 7.0 | 7.2 | 6.25 |
| 11-11 | 7.5 | 7.2 | 6.0 | 6.0 | 5.8 | 6.5 | 6.2 | 6.0 | 6.40 |
| 11-12 | 5.8 | 5.5 | 5.5 | 7.5 | 8.0 | 7.7 | 6.5 | 5.5 | 6.50 |
| 11-13 | 6.3 | 7.5 | 6.2 | 7.0 | 5.5 | 6.8 | 7.5 | 5.8a | 6.58 |
| 11-14 | 6.7 | 7.0 | 6.5 | 7.0 | 7.5 | 7.0 | 6.2 | 6.0a | 6.74 |
| 11-15 | 5.5e | 6.5 | 5.6 | 5.0 | 5.0 | 5.2 | 5.0 | 5.5 | 5.16 |
| 11-16 | 7.5 | 6.5 | 5.5 | 5.0 | 5.5 | 6.0 | 6.8 | 5.5a | 6.04 |
| 11-17 | 5.8 | 5.5 | 5.0 | 5.5 | 5.2 | 5.5 | 5.5 | 5.5 | 5.44 |
| 11-18 | 6.0 | 6.0 | 6.2 | 5.5 | 5.2 | 5.0 | 5.2 | 5.0 | 5.51 |
| 11-19 | 5.5 | 5.5 | 6.0 | 5.5 | 5.5 | 5.3 | 5.5 | 5.2 | 5.50 |
| 11-20 | 6.0 | 5.7 | 5.5 | 5.2a | 6.0 | 6.0 | 6.2 | 5.8 | 5.80 |
| 11-21 | 5.5 | 5.5 | 6.0 | 6.0 | 5.8 | 6.5 | 5.5 | 5.7 | 5.81 |
| 11-22 | 7.0 | 6.7 | 6.5 | 6.5 | 7.0 | 7.5 | 6.8 | 7.0 | 6.88 |
| 11-23 | 6.5 | 6.0a | 6.2 | 7.3 | 6.0 | 7.5 | 6.5 | 7.6 | 6.70 |
| 11-24 | 6.0 | 6.0 | 6.5 | 5.5 | 6.0 | 6.0 | 7.2 | 6.0 | 6.15 |
| 11-25 | 6.2 | 6.0 | 6.0 | 6.8 | 5.5 | 6.3 | 6.8 | 6.5 | 6.26 |

As illustrated in example Table 3, 'x' denotes that the wire is not bounded in the regions between 'a' and 'e' when a predetermined force, for example, 5 g or more, is applied to the point of action 'f' for a predetermined test time. Further, data without any of designation 'a' to 'e' denote that the wire is bounded in region 'd.'

Accordingly, example Table 3 shows that wires 604 were bounded in regions 'a' to 'e' when the predetermined force is applied to point of action 'f.'

As illustrated in example FIG. 6, embodiments relate to a wire pad of semiconductor device 600 including first TEOS film 502 formed between low-k layer 500 and SiCN layer 504, exhibits an enhanced wire bonding force that is ten times that of wire pads of other semiconductor devices.

In accordance with embodiments, a wire pad of a semiconductor device is beneficial for not causing a wire to be bounded in wire bonding, thereby making it unnecessary to place or otherwise locate the semiconductor pad to one side in an EM/SM test. Moreover, the overall time required to produce an EM/SM test wafer is reduced.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art

What is claimed is:

1. An apparatus comprising:
    a low-k layer formed over the upper surface of a semiconductor device;
    an oxide layer formed over the upper surface of the low-k layer;
    a SiCN layer formed over the upper surface of the oxide layer;
    an undoped silicate glass film formed over the upper surface of the SiCN layer;
    a nitride film formed over the upper surface of the undoped silicate glass film;
    a TEOS film formed over the upper surface of the nitride film;
    a first metal interconnect extending from the low-k layer to the undoped silicate glass film; and
    a second metal interconnect extending from the nitride film to the TEOS film,
    wherein the first metal interconnect and the second metal interconnect are electrically connected.

2. The apparatus of claim 1, wherein the first metal interconnect comprises copper.

3. The apparatus of claim 1, wherein the second metal interconnect comprises an aluminum-copper material.

4. The apparatus of claim 1, wherein the nitride film comprises SiN.

5. The apparatus of claim 1, wherein the first metal interconnect is formed using a damascene process on the low-k layer to the TEOS film.

6. The apparatus of claim 1, further comprising a wire bonded to the second metal interconnect.

7. The apparatus of claim 1, wherein the low-k layer, the oxide layer, the SiCN layer, the undoped silicate glass film, the nitride film and the TEOS film are formed to predetermined thicknesses.

8. An apparatus comprising:
    a low-k layer formed over a semiconductor device;
    a first TEOS film formed over the low-k layer;
    a SiCN layer formed over the first TEOS film;
    an undoped silicate glass film formed over the SiCN layer;
    a nitride film formed over the USG film;
    a second TEOS film formed over the nitride film;
    a first metal interconnect extending from the low-k layer to the undoped silicate glass film; and
    a second metal interconnect extending from the nitride film to the second TEOS film
    wherein the first metal interconnect and the second metal interconnect are electrically connected.

9. The apparatus of claim 8, wherein the first metal interconnect comprises copper.

10. The apparatus of claim 8, wherein the second metal interconnect comprises an aluminum-copper material.

11. The apparatus of claim 8, wherein the first metal interconnect is formed using a damascene process on the low-k layer to the second TEOS film.

12. The apparatus of claim 8, further comprising a wire bonded to the second metal interconnect.

13. The apparatus of claim 8, wherein the low-k layer, the SiCN layer, the undoped silicate glass film, the nitride film, the first TEOS film and the second TEOS film are formed to predetermined thicknesses.

14. A method comprising:
    forming a low-k layer over a semiconductor device;
    forming an oxide layer over the low-k layer;
    forming a SiCN layer over the oxide layer;
    forming an undoped silicate glass film over the SiCN layer;
    forming a nitride film over the undoped silicate glass film;
    forming a TEOS film over the nitride film;
    forming a first metal interconnect extending from the low-k layer to the undoped silicate glass film; and
    forming a second metal interconnect extending from the nitride film to the TEOS film,
    electrically connecting the first metal interconnect and the second metal interconnect.

15. The method of claim 14, wherein the first metal interconnect comprises copper.

16. The method of claim 14, wherein the second metal interconnect comprises an aluminum-copper material.

17. The method of claim 14, wherein the nitride film comprises SiN.

18. The method of claim 14, wherein the first metal interconnect is formed using a damascene process on the low-k layer to the TEOS film.

19. The method of claim 1, further comprising bonding a wire to the second metal interconnect.

20. The method of claim 14, wherein the low-k layer, the oxide layer, the SiGN layer, the undoped silicate glass film, the nitride film and the TEOS film are formed to predetermined thicknesses.

* * * * *